US008976594B2

(12) United States Patent
Tanzawa

(10) Patent No.: US 8,976,594 B2
(45) Date of Patent: Mar. 10, 2015

(54) MEMORY READ APPARATUS AND METHODS

(75) Inventor: Toru Tanzawa, Tokyo (JP)

(73) Assignee: Micron Technology, Inc., Boise, ID (US)

(*) Notice: Subject to any disclaimer, the term of this patent is extended or adjusted under 35 U.S.C. 154(b) by 339 days.

(21) Appl. No.: 13/471,539

(22) Filed: May 15, 2012

(65) Prior Publication Data
US 2013/0308387 A1 Nov. 21, 2013

(51) Int. Cl.
G11C 11/34 (2006.01)

(52) U.S. Cl.
USPC ............. 365/185.18; 365/185.19; 365/185.14

(58) Field of Classification Search
USPC ............. 365/185.18, 185.14, 185.19, 185.23
See application file for complete search history.

(56) References Cited

U.S. PATENT DOCUMENTS

| | | | |
|---|---|---|---|
| 7,023,736 B2 | 4/2006 | Cernea | |
| 7,057,931 B2 | 6/2006 | Lutze et al. | |
| 7,893,084 B2* | 2/2011 | Beaulieu et al. | 514/300 |
| 7,898,317 B2 | 3/2011 | Choi | |
| 7,920,431 B2 | 4/2011 | Nobunaga et al. | |
| 7,995,400 B2 | 8/2011 | Sarin | |
| 8,120,952 B2* | 2/2012 | Han | 365/185.02 |
| 2005/0254302 A1 | 11/2005 | Noguchi | |
| 2006/0072359 A1 | 4/2006 | Futatsuyama et al. | |
| 2007/0230253 A1 | 10/2007 | Kim | |
| 2009/0040832 A1 | 2/2009 | Park | |
| 2011/0157978 A1 | 6/2011 | Shinozaki et al. | |
| 2011/0164452 A1 | 7/2011 | Parker | |
| 2011/0199829 A1 | 8/2011 | Lee et al. | |
| 2011/0267887 A1 | 11/2011 | Sekar et al. | |
| 2011/0273945 A1 | 11/2011 | Donkoh | |
| 2011/0280085 A1 | 11/2011 | Damle et al. | |
| 2012/0147673 A1 | 6/2012 | Nakamura et al. | |
| 2012/0281471 A1 | 11/2012 | Hung et al. | |
| 2013/0308385 A1 | 11/2013 | Tanzawa | |
| 2014/0160851 A1 | 6/2014 | Zhao et al. | |

FOREIGN PATENT DOCUMENTS

WO WO-2014089338 A1 6/2014

OTHER PUBLICATIONS

Cernea, Raul, et al., "A 34MB/s-Program-Throughput 16Gb MLC NAND with All-Bitline Architecture in 56nm", ISSCC Session 23.1, Non-Volatile Memory, (Feb. 2008), 420-421, 624.
Villa, Corrado, et al., "A 65 nm 1 Gb 2b/cell NOR Flash With 2.25 MB/s Program Throughput and 400 MB/s DDR Interface", IEEE Journal of Solid-State Circuits, vol. 43, No. 1, (Jan. 2008), 132-140.

(Continued)

Primary Examiner — Son Dinh
(74) Attorney, Agent, or Firm — Schwegman Lundberg & Woessner, P.A.

(57) ABSTRACT

Apparatus and methods are disclosed, including a method that raises an electrical potential of a plurality of access lines to a raised electrical potential, where each access line is associated with a respective charge storage device of a string of charge storage devices. The electrical potential of a selected one of the access lines is lowered, and a data state of the charge storage device associated with the selected access line is sensed while the electrical potential of the selected access line is being lowered. Additional apparatus and methods are described.

23 Claims, 10 Drawing Sheets

(56) References Cited

OTHER PUBLICATIONS

Cernea, Raul, et al., "A 34MB/s-Program-Throughput 16Gb MLC NAND with All-Bitline Architecture in 65nm", ISSCC Session 23.1, Non-Volatile Memory, (Feb. 2008), 622-624.

Katsumata, R, et al., "Pipe-shaped BiCS flash memory with 16 stacked layers and multilevel-cell operation for ultra high density storage devices", 2009 Symposium on VLSI Technology, (Jun. 2009), 136-37.

Tanaka, H., et al., "Bit Cost Scalable Technology with Punch and Plug Process for Ultra High Density Flash Memory", 2007 IEEE Symposium on VLSI Technology, (2007), 14-15.

Villa, Corrado, et al., "A 65 nm 1 Gb 2b/cell NOR Flash With 2.25 MB/s Program Throughput and 400 MB/s DDR Interface", IEEE Journal of Solid-State Circuits, vol. 34, No. 1, (Jan. 2008), 132-140.

"International Application Serial No. PCT/US2013/073385, International Search Report mailed Apr. 1, 2014", 4 pgs.

"International Application Serial No. PCT/US2013/073385, Written Opinion mailed Apr. 1, 2014", 7 pgs.

\* cited by examiner

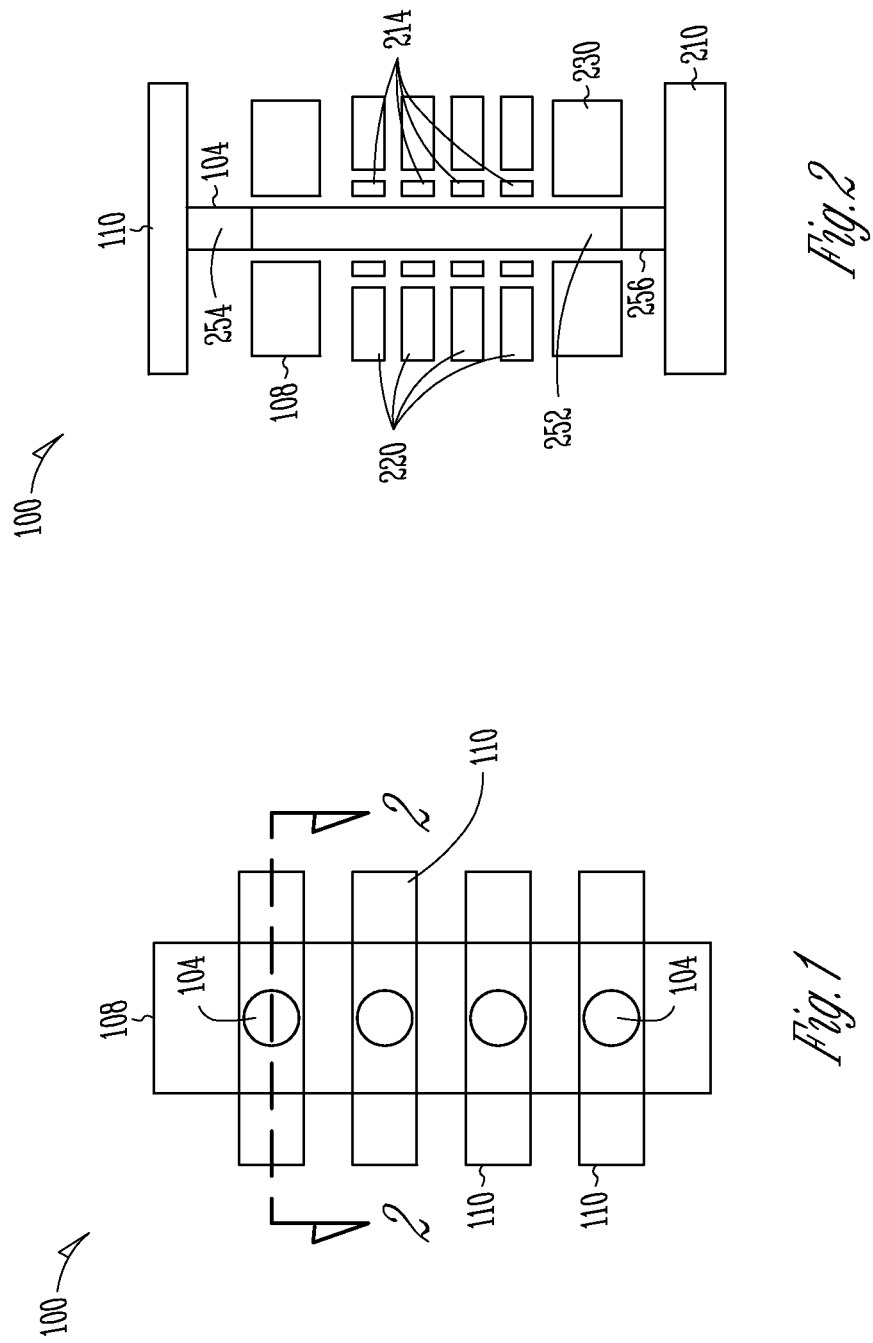

US 8,976,594 B2

MEMORY READ APPARATUS AND METHODS

BACKGROUND

Semiconductor memory devices are used in many electronic devices such as personal digital assistants (PDAs), laptop computers, mobile phones and digital cameras. Some of these semiconductor memory devices have arrays of charge storage devices.

BRIEF DESCRIPTION OF THE DRAWINGS

Some embodiments are illustrated by way of example and not limitation in the figures of the accompanying drawings in which:

FIG. 1 is a top view of an apparatus in the form of a semiconductor construction according to various embodiments of the invention;

FIG. 2 is a cross-sectional view of the semiconductor construction of FIG. 1 according to various embodiments of the invention;

DETAILED DESCRIPTION

Figure 3:
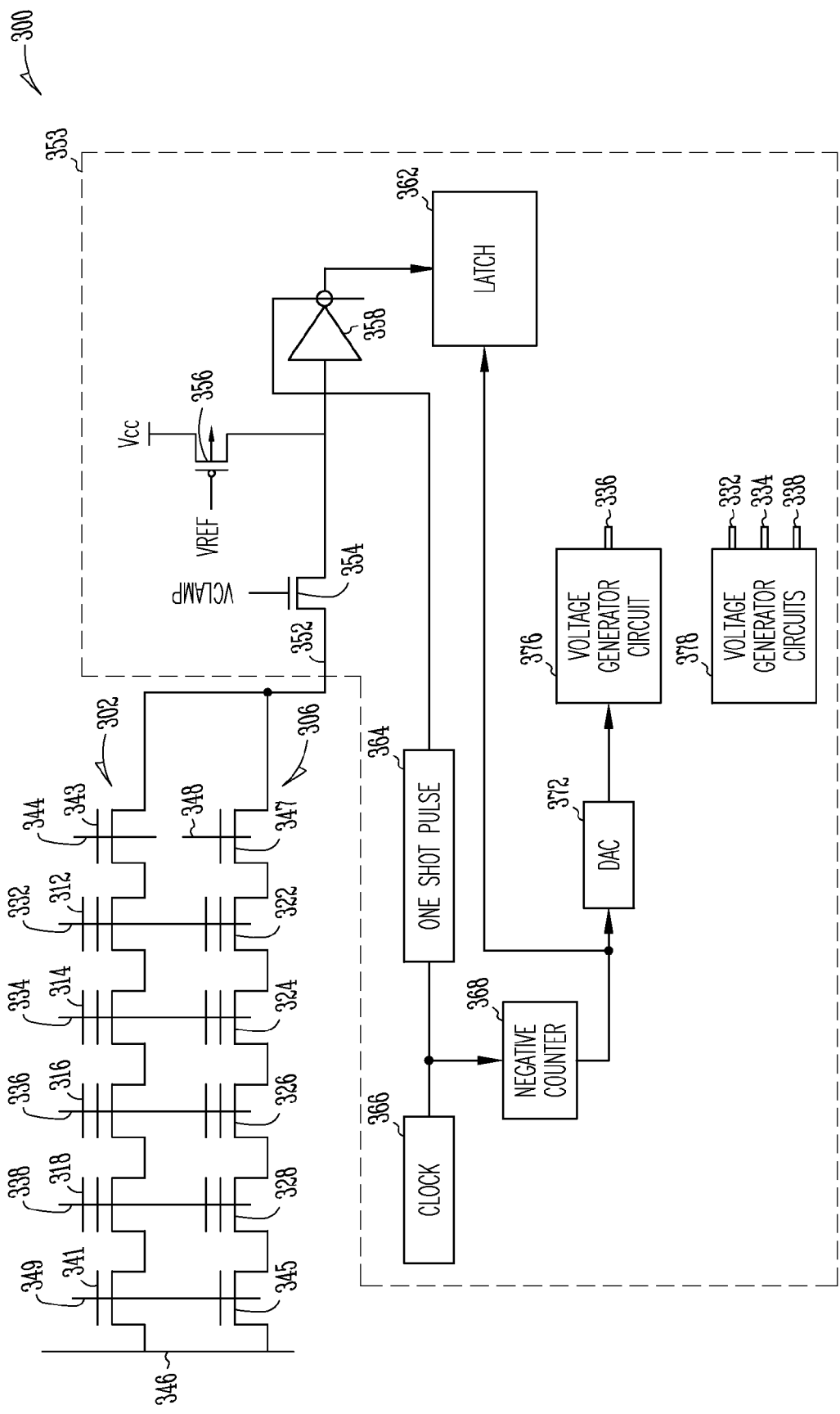
FIG. 3 is an electrical schematic diagram of an apparatus in the form of a memory circuit according to various embodiments of the invention.

An array of charge storage devices according to various embodiments of the invention may function as an array of memory cells in a memory device such as a NOT AND (NAND) memory device.

For the purposes of this document, a "tier of semiconductor material" can mean semiconductor material formed in a same plane, rank, row, or unit, such as in a horizontal or vertical or sloped plane, row, rank or unit of a structure. Meanwhile, an "apparatus" can refer to any of a number of structures, such as circuitry, a device or a system. In this description, a charge storage device or a transistor is described as being switched on to assume an activated state when it is rendered conductive by a control gate voltage that is separated from its source voltage by at least its threshold voltage. The charge storage device or the transistor is described as being switched off to assume an inactive state when the difference between the control gate voltage and the source voltage is less than the threshold voltage, so that the charge storage device or the transistor is rendered non-conductive.

FIG. 1 is a top view of an apparatus in the form of a semiconductor construction 100 according to various embodiments of the invention. The semiconductor construction 100 includes four pillars 104 comprising a semiconductor material. For example, the pillars 104 may comprise polysilicon. Each of the pillars 104 provides a channel for multiple charge storage devices in a string in a NAND memory device. A drain select gate (SGD) 108 surrounds or partially surrounds the pillars 104 and will be further described with respect to FIG. 2.

Each of the pillars 104 is coupled to a data line 110 that may be used to sense (e.g., read) a data state of one of the charge storage devices associated with the pillar 104. The data lines 110 may comprise, for example, polysilicon or metal, including one or more of cobalt (Co), titanium (Ti), tungsten (W), nickel (Ni) or tantalum (Ta) according to various embodiments of the invention. The semiconductor construction 100 can include different numbers of pillars 104 according to various embodiments of the invention.

FIG. 2 is a cross-sectional view of the semiconductor construction 100 of FIG. 1 along line 2-2 according to various embodiments of the invention. The pillars 104 extend from the data lines 110 to a p-type silicon substrate 210. A number of charge storage devices 214 surround or partially surround the pillars 104 between the data lines 110 and the silicon substrate 210. Regions of the pillars 104 between the charge storage devices 214 are source regions or drain regions of the charge storage devices 214. A number of tiers of metal or semiconductor material surround or partially surround the pillars 104 between the data lines 110 and the silicon substrate 210. A majority of the tiers are access lines 220 to control the charge storage devices 214 that receive and release charge through the pillars 104. Each of the access lines 220 surrounds or partially surrounds all of the pillars 104.

A tier between the access lines 220 and the data lines 110 is the SGD 108 that may substantially control conduction between the pillars 104 and the data lines 110. A tier below the access lines 220 is a source select gate (SGS) 230 that may at least partially control conduction between the pillars 104 and the silicon substrate 210. The pillars 104 are surrounded or partially surrounded by the SGS 230.

The charge storage devices 214, the access lines 220, the SGD 108, the SGS 230, the data lines 110, and the silicon substrate 210 can be separated from each other by a dielectric such as, for example, silicon dioxide ($SiO_2$). The access lines 220, the SGD 108 and the SGS 230 may comprise tiers of a semiconductor material such as silicon or polysilicon or polysilicon doped with Phosphorous or Boron. The access lines 220, the SGD 108 and the SGS 230 may also comprise metal including one or more of Cobalt (Co), Titanium (Ti), Tungsten (W), Nickel (Ni) or Tantalum (Ta) according to various embodiments of the invention.

The access lines 220 can control the charge storage devices 214 surrounding or partially surrounding each pillar 104. Each charge storage device 214 may comprise, for example, a floating gate transistor or a charge trap transistor. The SGD 108 and the SGS 230 are transistors surrounding or partially surrounding each pillar 104. Each pillar 104 comprises p-type polysilicon 252 adjacent to the access lines 220, the SGD 108 and the SGS 230. Each pillar 104 comprises first n-type polysilicon 254 between the p-type polysilicon 252 and the data lines 110. Each pillar 104 comprises second n-type polysilicon 256 between the p-type polysilicon 252 and the silicon substrate 210. Bodies of the SGD 108, the SGS 230 and the charge storage devices 214 are not directly connected to a reference voltage (e.g., ground voltage) but are in a floating state.

The data lines 110 are associated with respective ones of the pillars 104. Each charge storage device 214 is associated with one of the pillars 104 and one of the respective access lines 220. Each SGD 108 and each SGS 230 is associated with one of the pillars 104. The access lines 220 are adjacent to each other, and each access line 220 is adjacent to at least one other access line 220. Capacitive coupling can occur between the access lines 220.

The capacitive coupling between the access lines 220 can lengthen a read operation when an electrical potential of a selected access line 220 is pulled up due to activity in neighboring access lines 220. The electrical potential of the selected access line 220 usually settles to an initial read potential before the read operation can take place, and this can delay the read operation. The inventor has discovered that the challenge noted above, as well as others, can be addressed by, for example, raising the electrical potential of a number of access lines to a raised electrical potential, each access line associated with a respective charge storage device of a string of charge storage devices, lowering the electrical potential of a selected one of the access lines, and sensing a data state of the charge storage device associated with the selected access line while the electrical potential of the selected access line is being lowered.

FIG. 3 is an electrical schematic diagram of an apparatus in the form of a memory circuit 300 according to various embodiments of the invention. Illustrated in FIG. 3 are two strings 302 and 306 of charge storage devices. The string 302 includes four charge storage devices 312, 314, 316 and 318. The string 306 includes four charge storage devices 322, 324, 326 and 328. The strings 302 and 306 may be located in an array with other strings of charge storage devices (not shown). The strings 302 and 306 can each include more than four charge storage devices. The strings 302 and 306 share access lines 332, 334, 336 and 338. Each of the access lines 332, 334, 336 and 338 are shown as being coupled to a pair of control gates of the charge storage devices 312 and 322, 314 and 324, 316 and 326 and 318 and 328, respectively. The charge storage devices 312 and 322 are controlled by a signal on the access line 332. The charge storage devices 314 and 324 are controlled by a signal on the access line 334. The charge storage devices 316 and 326 are controlled by a signal on the access line 336. The charge storage devices 318 and 328 are controlled by a signal on the access line 338.

Each of the strings 302 and 306 may comprise a pillar such as one of the pillars 104 of the semiconductor construction 100 of FIG. 1 and FIG. 2 according to various embodiments of the invention. Charge storages devices such as the charge storage devices 214 surround or partially surround the pillar 104. The pillar 104 is surrounded or partially surrounded by an SGS such as the SGS 230 and by an SGD such as the SGD 108 of the semiconductor construction 100 of FIG. 1 and FIG. 2.

The string 302 includes an SGS transistor 341, which is an n-channel transistor coupled between the charge storage device 318 and a common source 346. At the other end of the string 302, an SGD transistor 343 is an n-channel transistor coupled between the charge storage device 312 and the rest of the memory circuit 300. A control gate of the SGD transistor 343 is coupled to a line 344 having a signal that controls the SGD transistor 343 to select or deselect the string 302.

The string 306 includes a SGS transistor 345 which is an n-channel transistor coupled between the charge storage device 328 and the common source 346. At the other end of the string 306, a SGD transistor 347 is an n-channel transistor coupled between the charge storage device 322 and the rest of the memory circuit 300. A control gate of the SGD transistor 347 is coupled to a line 348 having a signal that controls the SGD transistor 347 to select or deselect the string 306. Control gates of the SGS transistors 341 and 345 are coupled to a line 349 having a signal that controls the SGS transistors 341 and 345.

The SGD transistors 343 and 347 are coupled together to a data (e.g., bit) line 352, which is in turn coupled to a sense and latch circuit 353 through an n-channel bias transistor 354. The bias transistor 354 has a source coupled to the data line 352. The bias transistor 354 has a drain coupled to a drain of a p-channel load transistor 356 and an input of a triggered inverter 358. The load transistor 356 has a source coupled to a voltage supply Vcc node. A control signal VCLAMP is coupled to a control gate of the bias transistor 354, and a control signal VREF is coupled to a control gate of the load transistor 356.

A data signal from the data line 352 is coupled to the input of the triggered inverter 358 when the bias transistor 354 is rendered conductive by the control signal VCLAMP. The state of the data signal on the data line 352 is provided through the triggered inverter 358 to a latch 362 when the triggered inverter 358 is enabled by a pulse produced by a one-shot pulse circuit 364. The one-shot pulse circuit 364 and the latch 362 are both coupled to the triggered inverter 358.

The one-shot pulse circuit 364 is coupled to receive a clock signal from a clock circuit 366 that is also coupled to provide the clock signal to a negative counter circuit 368. The one-shot pulse circuit 364 produces the pulses on edges of the clock signal from the clock circuit 366. Each pulse comprises a raised electrical potential of a limited duration.

The negative counter circuit 368 produces a digital signal having a value corresponding to a hexadecimal number that incrementally changes (e.g., counts down) from FF to 00 on the edges of the clock signal from the clock circuit 366. The digital signal produced by the counter circuit 368 is coupled to the latch 362 and a digital-to-analog converter (DAC) 372. The DAC 372 converts the digital signal to an analog signal, and the analog signal is coupled to a voltage generator 376 that can produce a sense voltage on the access line 336 coupled to selected charge storage devices 316 and 326. The electrical potential of the sense voltage changes for each increment of change of the value of the digital signal produced by counter circuit 368. The same or other voltage generator circuits 378 can produce signals on the access lines 332, 334 and 338 and the lines 344, 348 and 349 (as used herein, "a voltage generator circuit" can refer to a single voltage generator circuit, such as voltage generator circuit 376, or can refer to a combination of voltage generator circuits, such as voltage generator circuits 376 and 378, or portions thereof).

The strings 302 and 306 of charge storage devices are located in an array of charge storage devices. The data line 352, the bias transistor 354, the load transistor 356, the triggered inverter 358, the latch 362, the one-shot pulse circuit 364, the clock circuit 366, the negative counter circuit 368, the DAC 372, the voltage generator 376 and the other voltage generator circuits 378 are part of the sense and latch circuit 353 coupled to the array of charge storage devices through the data line 352. There can be more than two strings of charge storage devices coupled to be read by the sense and latch circuit 353 through the data line 352. The common source 346 may be coupled to other strings of charge storage devices (not shown).

Figure 4:
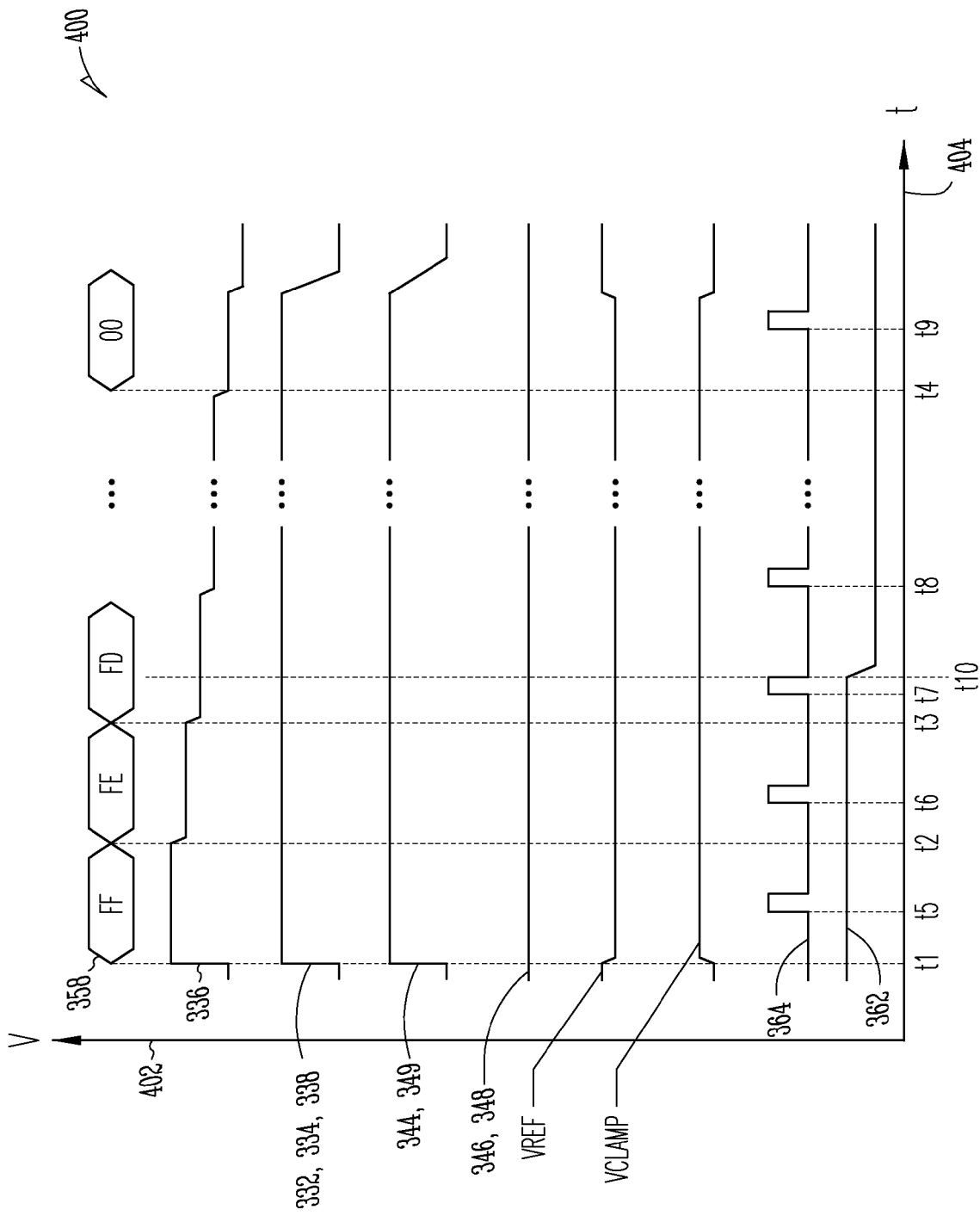
FIG. 4 is a timing diagram for the memory circuit of FIG. 3 according to various embodiments of the invention.

FIG. 4 is a timing diagram 400 for the memory circuit 300 of FIG. 3 according to various embodiments of the invention. The timing diagram 400 illustrates signals and electrical potentials in the memory circuit 300 during a read operation for the charge storage device 316. The signals and electrical potentials are represented by voltage V on a vertical axis 402 and time t on a horizontal axis 404. Portions of the timing diagram 400 are not shown explicitly; rather, these portions are represented by dashed lines for purposes of brevity and clarity.

The control signal VREF can be lowered (e.g., reduced) from approximately 2 volts to approximately 1 volt for the entire read operation to render the load transistor 356 conductive. In addition, the control signal VCLAMP can be raised from about 0 volts to about 1.5 volts to render the bias transistor 354 conductive for the entire read operation such that the data line 352 and the string 302 are charged from the voltage supply Vcc node. The common source 346 can be coupled to approximately 0 volts for the entire read operation. The line 348 can also be coupled to approximately 0 volts for the entire read operation to switch off the SGD transistor 347 to substantially electrically isolate the string 306 from the data line 352 to deselect the string 306. The access lines 332, 334 and 338 can be raised from about 0 volts to about 4 volts for the entire read operation to switch on the charge storage devices 312, 314 and 318. The lines 344 and 349 can be raised from about 0 volts to about 4 volts for the entire read operation to switch on the SGS transistors 341 and 345 and the SGD transistor 343 to select the string 302 to be electrically coupled to the data line 352.

At the top of the timing diagram 400 is a hexadecimal number corresponding to a value of the digital signal produced by the negative counter circuit 368. The hexadecimal number is FF at a time t1 and the digital signal corresponding to the hexadecimal number can be incrementally lowered at times t2 and t3 through t4 in response to the edges of the clock signal from the clock circuit 366. The voltage on the access line 336 of the selected charge storage device 316 can be raised from about 0 volts to about 4 volts at the time t1 and can thereafter be lowered by about 0.2 volts each time the digital signal corresponding to the hexadecimal number is lowered. The electrical potential of the access line 336 is about 0 volts when the value of the digital signal corresponds to hexadecimal number 00. The electrical potential of the access line 336 can thereby be lowered by voltage increments, and the voltage increments may be more or less than 0.2 volts according to various embodiments of the invention. The electrical potential of the access line 336 was raised at approximately the same rate as the electrical potential of the access lines 332, 334 and 338. The electrical potential of the access line 336 can be lowered at a lower rate than it was raised.

At time t1 of the read operation all of the charge storage devices 312, 314, 316 and 318, the SGD transistor 343, the SGS transistor 341, the bias transistor 354 and the load transistor 356 are switched on and charge is flowing from the voltage supply Vcc node to the common source 346 at approximately 0 volts. The data line 352 is therefore also at approximately 0 volts.

The one-shot pulse circuit 364 produces pulses at times t5, t6, t7 and t8 through t9 in response to the edges of the clock signal from the clock circuit 366. A data signal from the data line 352 is inverted by the triggered inverter 358 and provided to the latch 362 when the triggered inverter 358 is enabled by one of the pulses from the one-shot pulse circuit 364. The data signal is approximately 0 volts from the time t1 when all of the charge storage devices 312, 314, 316 and 318 are conductive to about the time t10. The inverted data signal provided to the latch 362 begins at approximately 2 volts at the time t1 and falls to approximately 0 volts at time t10 to indicate that there has been a change in conduction of the charge storage device 316 responsive to an electrical potential of the access line 336 being lowered to approximately 3.6 volts, causing the data signal to rise and the latch 362 to latch a corresponding current value of the digital signal produced by the counter circuit 368 (which in this case corresponds to the hexadecimal number FD).

At the end of the read operation, the control signal VREF rises from about 1 volt to about 2 volts to switch off the load transistor 356 and the control signal VCLAMP is lowered from about 1.5 volts to about 0 volts to switch off the bias transistor 354 such that the data line 352 and the selected string 302 are substantially isolated from the voltage supply Vcc node. The electrical potentials of the access lines 332, 334, 336 and 338 are approximately 0 volts. The lines 344 and 349 are lowered to approximately 0 volts to switch off the SGS transistors 341 and 345 and the SGD transistor 343.

With reference to FIGS. 1-4, the SGS transistors 341 and 345 can be switched on and the access lines 332, 334, 336 and 338 can be at about 4 volts at the beginning of the read operation at the time t1. The common source 346 in the substrate 210 can be at about 0 volts. The pillar 104 can have an electrical potential of about 0.6 volts due to a forward-biased junction between the pillar 104 and the substrate 210. There may not be a potential difference larger than about 3 volts between a source and a drain in the pillars 104 of the memory circuit 300 regardless of whether the pillars 104 are selected or deselected.

If the selected access line 336 were to stay at about 0 volts at the time t1 while the other access lines 332, 334 and 338 are raised along with the control gates of the SGS transistors 341 and 345 to about 4 volts, the electrical potential of the source of the charge storage device 326 could be about 0 volts via the charge storage device 328 and the SGS transistor 345, but the drain of the charge storage device 326 could be as high as 4 volts due to capacitive coupling between the access lines 332 and 334 and the pillar 104 according to various embodiments of the invention. This occurs because the charge storage device 326 can be switched off and the deselected SGD transistor 347 can be switched off with the line 348 at about 0 volts. About 4 volts from the access lines 332 and 334 can boost the potential of the pillar 104 between the charge storage device 326 and the SGD transistor 347. In this case, the charge storage device 326 can have about 0 volts at its source and about 4 volts at its drain. Such a voltage difference between a drain and a source of the charge storage device 326 can generate hot carriers in a channel when the threshold voltage of the charge storage device 326 is a negative voltage. The hot carriers can be injected into the charge storage device 326, and this is called a Channel Hot Carrier injection (CHC) condition. If the number of injected electrons is larger than a threshold or the injection occurs repeatedly, the data stored in the charge storage device 326 can be altered in a read disturb event. The inventor has discovered that the challenge noted above, as well as others, can be addressed by, for example, raising the line 348 to about 4 volts at the time t1 to capacitively couple the pillar 104 to about 4 volts, and then the line 348 can be pulled down to about 0 volts to substantially avoid such a read disturb. Such an operation can require additional timing, but can result in higher data reliability and/or a faster read operation without switching the deselected SGD transistor 347 on and off.

Figure 5:
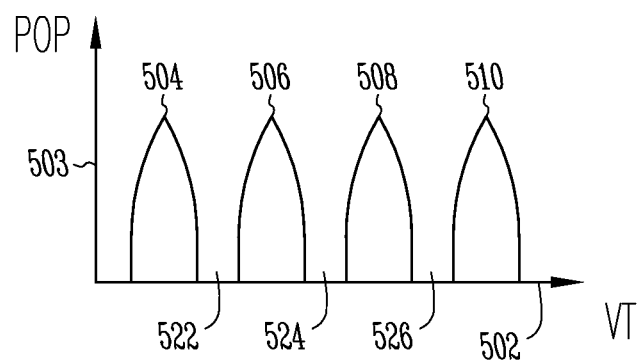
FIG. 5 is a diagram of potential data states for a particular multilevel charge storage device according to various embodiments of the invention.

The charge storage devices 312, 314, 316, 318, 322, 324, 326 and 328 may be multilevel charge storage devices. Thus, FIG. 5 is a diagram of potential data states 500 for a particular multilevel charge storage device according to various embodiments of the invention. A range of threshold voltage VTs corresponding to each data state is shown on a horizontal axis 502, and a population POP of VTs for a multilevel charge storage device is shown on a vertical axis 503. The population of VTs is distributed into four data states 504, 506, 508 and 510. The respective VT ranges of each of the data states 504, 506, 508 and 510 are separated from each other by a voltage margin. The data states 504, 506, 508 and 510 can be used to represent two data bits. The value of those two bits are arranged so that adjacent data states have values that differ by only one bit, such as to lower the impact of errors in reading the contents of the multilevel charge storage device. A multilevel charge storage device may have more or less than four potential data states that can represent more or less than two data bits (e.g., 1.5 data bits, three data bits, etc.).

The multilevel charge storage device can be read by applying different sense voltages to a control gate and sensing any current flow through the multilevel charge storage device for each sense voltage. For example, three different sense voltages 522, 524 and 526 can be provided to the control gate of the multilevel charge storage device at different times. Each of the sense voltages 522, 524 and 526 falls inside a voltage margin between a respective two of the data states 504, 506, 508 and 510.

Figure 6:
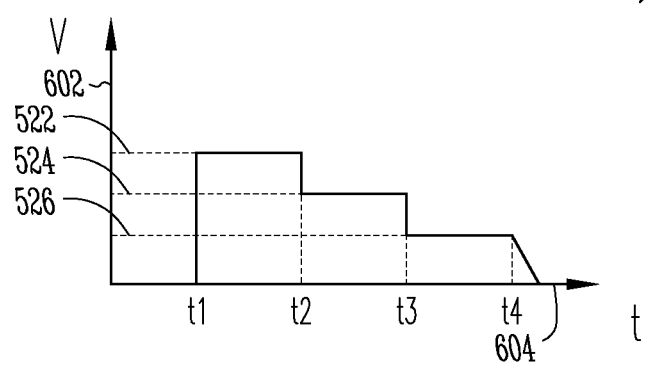
FIG. 6 is a timing diagram for the memory circuit of FIG. 3 according to various embodiments of the invention.

FIG. 6 is a timing diagram 600 for the memory circuit 300 of FIG. 3 according to various embodiments of the invention. The timing diagram 600 shows three sense voltages applied to a selected control gate of a multilevel charge storage device having a VT in one of the four data states 504, 506, 508 and 510. The sense voltages are represented by voltage V on a vertical axis 602 and the read operation is shown with respect to time t on a horizontal axis 604. The highest sense voltage 522 is applied to the selected control gate first at time t1. The middle sense voltage 524 is applied to the selected control gate next at time t2. The lowest sense voltage 526 is applied to the selected control gate last at time t3. The sense voltage falls after time t4. The presence or absence of current flow in the multilevel charge storage device is sensed while each sense voltage 522, 524 and 526 is applied to the selected control gate to determine the VT of the multilevel charge storage device. The sense voltages 522, 524 and 526 can be produced by a single, multi-level voltage generator, or by different voltage generators having their outputs applied to the control gate at different times through separate switches.

Figure 7:
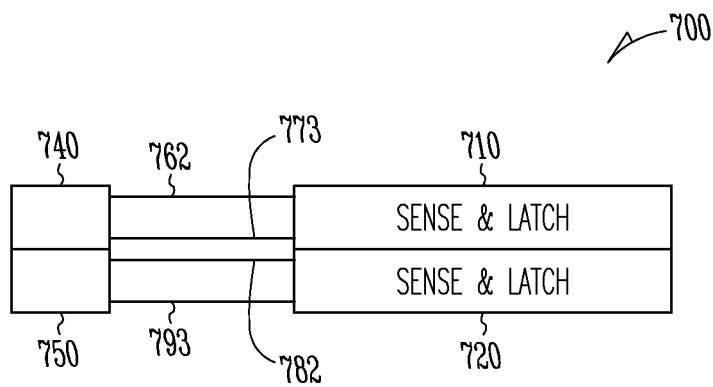
FIG. 7 is an electrical schematic diagram of an apparatus in the form of a memory circuit according to various embodiments of the invention.

FIG. 7 is an electrical schematic diagram of an apparatus in the form of a memory circuit 700 according to various embodiments of the invention. The memory circuit 700 includes first and second sense and latch circuits 710 and 720. Each sense and latch circuit 710 and 720 may comprise an instance of the sense and latch circuit 353 shown in FIG. 3 according to various embodiments of the invention. The first sense and latch circuit 710 is coupled to sense and latch data from a first pair 740 of strings of charge storage devices. The second sense and latch circuit 720 is coupled to sense and latch data from a second pair 750 of strings of charge storage devices. The first and second pairs 740 and 750 can each include the strings 302 and 306 of charge storage devices shown in FIG. 3 according to various embodiments of the invention.

The first sense and latch circuit 710 is coupled to sense data for a first even data line 762 and a first odd data line 773. The second sense and latch circuit 720 is coupled to sense data for a second even data line 782 and a second odd data line 793.

Data can be sensed for the even data lines 762 and 782 during a first period of time and data can be sensed for the odd data lines 773 and 793 during a second period of time. The alternating provision of even/odd data can shield the activity of the first even data line 762 from the activity of the first odd data line 773, which are adjacent to each other. The alternating provision of even/odd data can also shield the second even data line 782 from the second odd data line 793 which are adjacent to each other.

Figure 8:
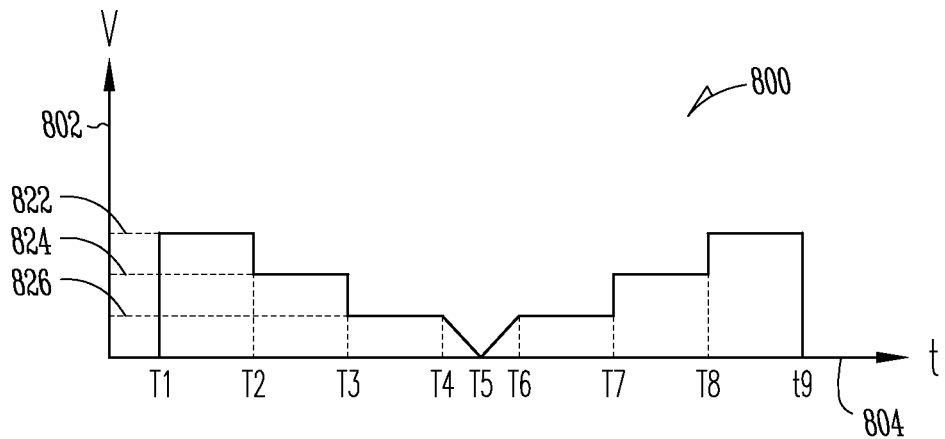
FIG. 8 is a timing diagram for the memory circuit of FIG. 7 according to various embodiments of the invention.

FIG. 8 is a timing diagram 800 for the memory circuit 700 of FIG. 7 according to various embodiments of the invention. The timing diagram 800 shows three sense voltages that can be applied to selected control gates of multilevel charge storage devices in the first and second pairs 740 and 750 of strings of charge storage devices. The sense voltages are represented by voltage V on a vertical axis 802 and a read operation is shown with respect to time t on a horizontal axis 804.

A highest sense voltage 822 is applied to selected control gates of charge storage devices first at time t1. A middle sense voltage 824 is applied to the selected control gates next at time t2. A lowest sense voltage 826 is applied to the selected control gates last at time t3. The sense voltage falls between time t4 and time t5. Data is sensed for the even data lines 762 and 782 between times t1 and t5. The sense voltage rises after time t5 to the lowest sense voltage 826 which is applied to the selected control gates at a time t6. The middle sense voltage 824 is applied to the selected control gates next at time t7. The highest sense voltage 822 is applied to the selected control gates next between times t8 and t9. Data is sensed for the odd data lines 773 and 793 between times t5 and t9. The presence or absence of current flow in the multilevel charge storage devices is sensed while each sense voltage 822, 824 and 826 is applied to the selected control gates to determine the VTs of the selected multilevel charge storage devices. The sense voltages 822, 824 and 826 can be produced by different voltage generators and applied to the selected control gate at different times through separate switches.

Figure 9:
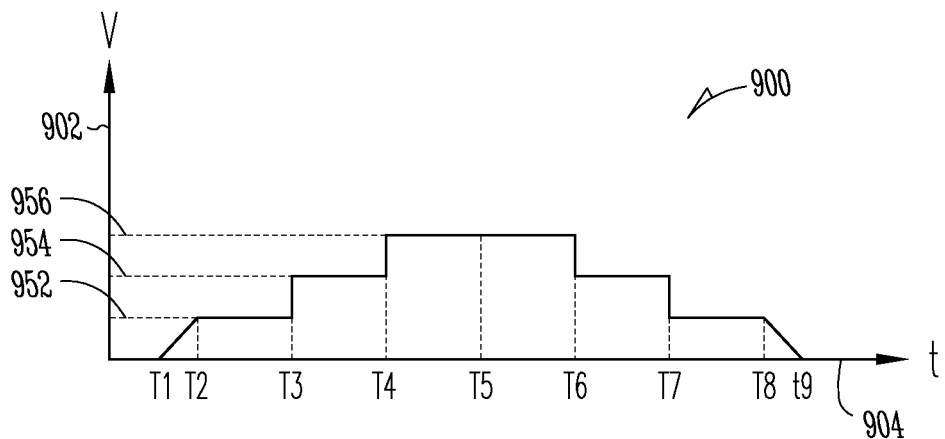
FIG. 9 is a timing diagram for the memory circuit of FIG. 7 according to various embodiments of the invention.

FIG. 9 is a timing diagram 900 for the memory circuit 700 of FIG. 7 according to various embodiments of the invention. The timing diagram 900 shows three sense voltages that can be applied to selected control gates of multilevel charge storage devices in the first and second pairs 740 and 750 of strings of charge storage devices. The sense voltages are represented by voltage V on a vertical axis 902 and a read operation is shown with respect to time t on a horizontal axis 904.

A sense voltage rises at time t1 to the lowest sense voltage 952 that is applied to selected control gates of charge storage devices first at time t2. The middle sense voltage 954 is applied to the selected control gates next at time t3. The highest sense voltage 956 is applied to the selected control gates at a time t4 and remains there through a time t5 to a time t6. Data is sensed for the even data lines 762 and 782 between times t1 and t5. The sense voltage falls after time t6 to the middle sense voltage 954 which is applied to selected control gates at a time t6. The lowest sense voltage 952 is applied to the selected control gates next at time t7 through a time t8. The sense voltage falls between times t8 and t9. Data is sensed for the odd data lines 773 and 793 between times t5 and t8. The presence or absence of current flow in the multilevel charge storage devices is sensed while each sense voltage 952, 954 and 956 is applied to the selected control gates to determine the VTs of the selected multilevel charge storage devices. The sense voltages 952, 954 and 956 can be produced by a single multi-voltage generator, or by different voltage generators having their outputs applied to the control gate at different times through separate switches.

Figure 10:
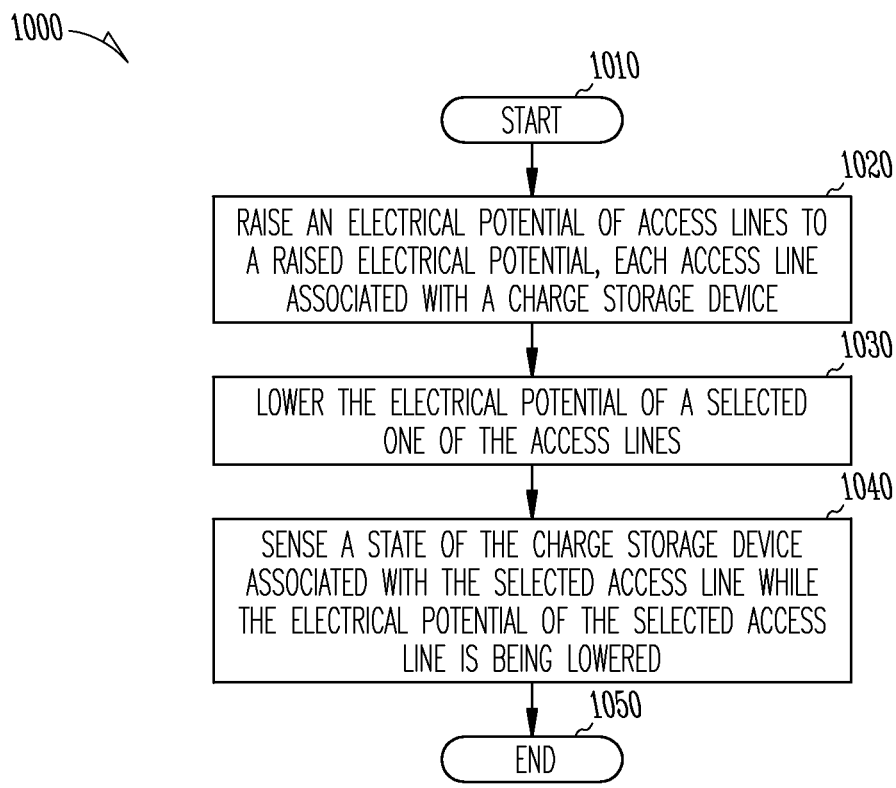
FIG. 10 is a flow diagram of a method according to various embodiments of the invention.

FIG. 10 is a flow diagram of a method 1000 according to various embodiments of the invention. In block 1010, the method 1000 starts. In block 1020, an electrical potential of access lines is raised to a raised electrical potential, each access line associated with a respective charge storage device of a string of charge storage devices. In block 1030, the electrical potential of a selected one of the access lines is lowered. In block 1040, a data state of the charge storage device associated with the selected access line is sensed while the electrical potential of the selected access line is being lowered. In block 1050, the method 1000 ends. During the activity occurring at blocks 1020, 1030, and 1040, the electrical potential may be applied to individual access lines as noted with respect to the timing diagrams of FIGS. 8 and 9. Various embodiments may have more or fewer activities than those shown in FIG. 10. In some embodiments, the activities may be repeated, and/or performed in serial or parallel fashion. Some embodiments may comprise the same activities in a different order.

Figure 11:
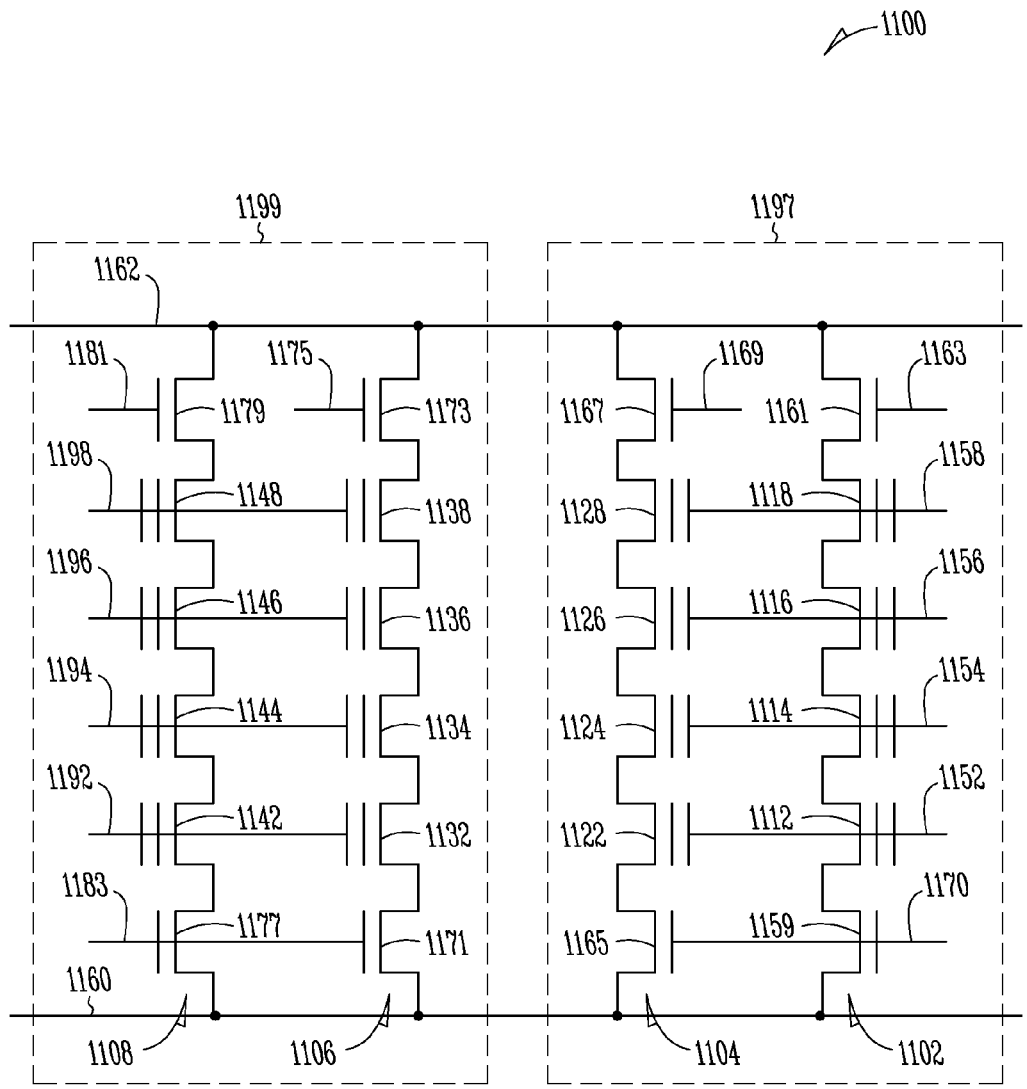
FIG. 11 is an electrical schematic diagram of an apparatus in the form of a memory circuit according to various embodiments of the invention.

FIG. 11 is an electrical schematic diagram of an apparatus in the form of a memory circuit 1100 according to various embodiments of the invention. Illustrated in FIG. 11 are four strings 1102, 1104, 1106 and 1108 of charge storage devices. The string 1102 includes four charge storage devices 1112, 1114, 1116 and 1118. The string 1104 includes four charge storage devices 1122, 1124, 1126 and 1128. The string 1106 includes four charge storage devices 1132, 1134, 1136 and 1138. The string 1108 includes four charge storage devices 1142, 1144, 1146 and 1148. The strings 1102, 1104, 1106 and 1108 may be located in an array with other strings of charge storage devices (not shown). Each of the charge storage devices in the strings 1102, 1104, 1106 and 1108 has the four data states 504, 506, 508 and 510 shown in FIG. 5. The strings 1102, 1104, 1106 and 1108 can each include more than four charge storage devices.

Each of the strings 1102, 1104, 1106 and 1108 may comprise a pillar such as one of the pillars 104 of the semiconductor construction 100 of FIG. 1 and FIG. 2 according to various embodiments of the invention. Charge storage devices such as the charge storage devices 214 surround or partially surround the pillar 104. The pillar 104 is surrounded or partially surrounded by an SGS such as the SGS 230 and by an SGD such as the SGD 108 of the semiconductor construction 100 of FIG. 1 and FIG. 2.

The strings 1102 and 1104 share access lines 1152, 1154, 1156 and 1158. Each of the access lines 1152, 1154, 1156 and 1158 are shown as being coupled to a pair of control gates of the charge storage devices 1112 and 1122, 1114 and 1124, 1116 and 1126 and 1118 and 1128, respectively. The charge storage devices 1112 and 1122 are controlled by a signal on the access line 1152. The charge storage devices 1114 and 1124 are controlled by a signal on the access line 1154. The charge storage devices 1116 and 1126 are controlled by a signal on the access line 1156. The charge storage devices 1118 and 1128 are controlled by a signal on the access line 1158.

The string 1102 includes an SGS transistor 1159, which is an n-channel transistor coupled between the charge storage device 1112 and a common source 1160. At the other end of the string 1102, an SGD transistor 1161 is an n-channel transistor coupled between the charge storage device 1118 and a data (e.g., bit) line 1162. A control gate of the SGD transistor 1161 is coupled to a line 1163 having a signal that controls the SGD transistor 1161 to select or deselect the string 1102.

The string 1104 includes a SGS transistor 1165 which is an n-channel transistor coupled between the charge storage device 1122 and the common source 1160. At the other end of the string 1104, a SGD transistor 1167 is an n-channel transistor coupled between the charge storage device 1128 and the data line 1162. A control gate of the SGD transistor 1167 is coupled to a line 1169 having a signal that controls the SGD transistor 1167 to select or deselect the string 1104. Control gates of the SGS transistors 1159 and 1165 are coupled to a line 1170 having a signal that controls the SGS transistors 1159 and 1165.

The string 1106 includes a SGS transistor 1171 which is an n-channel transistor coupled between the charge storage device 1132 and the common source 1160. At the other end of the string 1106, a SGD transistor 1173 is an n-channel transistor coupled between the charge storage device 1138 and the data line 1162. A control gate of the SGD transistor 1173 is coupled to a line 1175 having a signal that controls the SGD transistor 1173 to select or deselect the string 1106.

The string 1108 includes a SGS transistor 1177 which is an n-channel transistor coupled between the charge storage device 1142 and the common source 1160. At the other end of the string 1108, a SGD transistor 1179 is an n-channel transistor coupled between the charge storage device 1148 and the data line 1162. A control gate of the SGD transistor 1179 is coupled to a line 1181 having a signal that controls the SGD transistor 1179 to select or deselect the string 1108. Control gates of the SGS transistors 1171 and 1177 are coupled to a line 1183 having a signal that controls the SGS transistors 1171 and 1177.

The strings 1106 and 1108 share access lines 1192, 1194, 1196 and 1198. Each of the access lines 1192, 1194, 1196 and 1198 are shown as being coupled to a pair of control gates of the charge storage devices 1132 and 1142, 1134 and 1144, 1136 and 1146 and 1138 and 1148, respectively. The charge storage devices 1132 and 1142 are controlled by a signal on the access line 1192. The charge storage devices 1134 and 1144 are controlled by a signal on the access line 1194. The charge storage devices 1136 and 1146 are controlled by a signal on the access line 1196. The charge storage devices 1138 and 1148 are controlled by a signal on the access line 1198.

The strings 1102, 1104, 1106 and 1108 are in a block of charge storage devices coupled to the common source 1160 and the data line 1162. The block can include more strings or more charge storage devices according to various embodiments of the invention. The strings 1102 and 1104 are part of a first sub-block 1197 of charge storage devices. The strings 1106 and 1108 are part of a second sub-block 1199 of charge storage devices. Both of the sub-blocks 1197 and 1199 of charge storage devices are coupled to the common source 1160 and the data line 1162.

Figure 12:
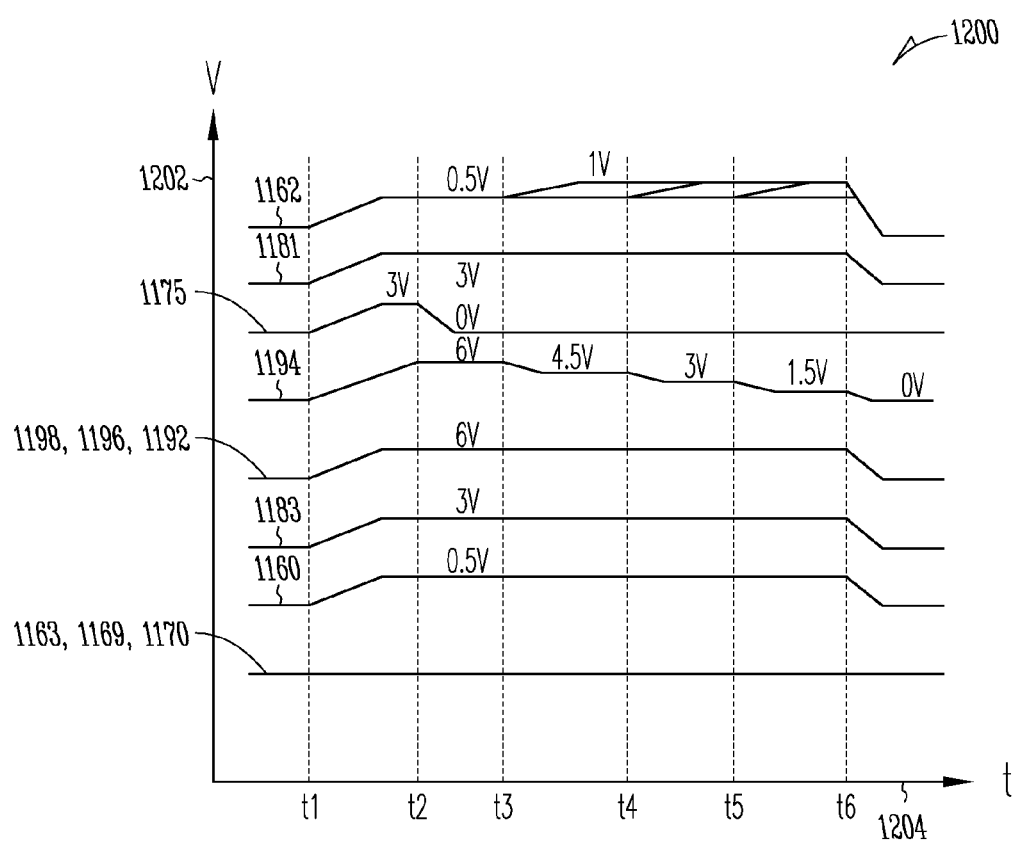
FIG. 12 is a timing diagram for the memory circuit of FIG. 11 according to various embodiments of the invention.

FIG. 12 is a timing diagram 1200 for the memory circuit 1100 of FIG. 11 according to various embodiments of the invention. The timing diagram 1200 illustrates signals and electrical potentials in the memory circuit 1100 during a read operation for the charge storage device 1144 in the string 1108 of the sub-block 1199. The signals and electrical potentials are represented by voltage V on a vertical axis 1202 and time t on a horizontal axis 1204.

The common source 1160 can be raised from a reference voltage (e.g., ground voltage) at a time t1 to about 0.5 volts where it remains until an end of the read operation. An electrical potential of the data line 1162 can also be raised from the reference voltage at the time t1 to about 0.5 volts until the end of the read operation, and this potential can change depending on the data state of the selected charge storage device 1144 being read.

The line 1183 can be raised from a reference voltage at the time t1 to about 3 volts to switch on the SGS transistors 1171 and 1177 to couple the strings 1106 and 1108 to the common source 1160 until the end of the read operation. All of the charge storage devices 1132, 1134, 1136, 1138, 1142, 1144, 1146 and 1148 in the sub-block 1199 can be switched on by raising a potential of the access lines 1192, 1194, 1196 and 1198 from the reference voltage at the time t1 to about 6 volts at the time t2. The line 1181 can be raised from the reference voltage at the time t1 to about 3 volts to switch on the SGD transistor 1179 to select the string 1108 by coupling it to the data line 1162 until the end of the read operation. The line 1175 can be raised from the reference voltage at the time t1 to about 3 volts at the time t2 and the SGD transistor 1173 is switched on by the raised potential of the line 1175 at about the time t2 to couple the string 1106 to the data line 1162.

At about the time t2, all of the charge storage devices 1132, 1134, 1136, 1138, 1142, 1144, 1146 and 1148 in the sub-block 1199 are switched on. Pillars of both strings 1106 and 1108 reach approximately 0.5 volts at about the time t2 while being coupled to the data line 1162 and the common source 1160 to substantially avoid the CHC condition and an associated read disturb event. The voltage on the line 1175 can be lowered to the reference voltage between the time t2 and the time t3 to deselect the string 1106 by switching off the SGD transistor 1173 to substantially electrically isolate the string 1106 from the data line 1162 before the charge storage device 1144 is read.

The charge storage devices 1132, 1136, 1138, 1142, 1146 and 1148 in the sub-block 1199 remain switched on until the end of the read operation while the electrical potential of the line 1194 is lowered to read the charge storage device 1144. The voltage on the access line 1194 of the selected charge storage device 1144 can be lowered by about 1.5 volts at times t3, t4, t5 and t6 so that it is about 0 volts at the end of the read operation. The electrical potential of the access line 1194 can thereby be lowered by voltage increments, and the voltage increments may be more or less than 1.5 volts according to various embodiments of the invention. The conductive state of the selected charge storage device 1144 can change while the potential of the access line 1194 is being lowered, and this can result in a change in the electrical potential of the data line 1162 that is sensed and amplified by a sensing circuit (not shown) to read the data state of the charge storage device 1144 between the time t1 and the time t6. The electrical potential of the access line 1194 was raised at approximately the same rate as the electrical potential of the access lines 1192, 1196 and 1198. The electrical potential of the access line 1194 can be lowered at a lower rate than it was raised. The state of the charge storage device 1144 is read by a sense and latch circuit such as the sense and latch circuit 353 shown in FIG. 3 and described above according to various embodiments of the invention.

The sub-block 1197 is deselected during the read operation. The lines 1163, 1169 and 1170 can be at the reference voltage to switch off the SGD transistors 1161 and 1167 and the SGS transistors 1159 and 1165. The access lines 1152, 1154, 1156 and 1158 can be in a floating state during the read operation.

Figure 13:
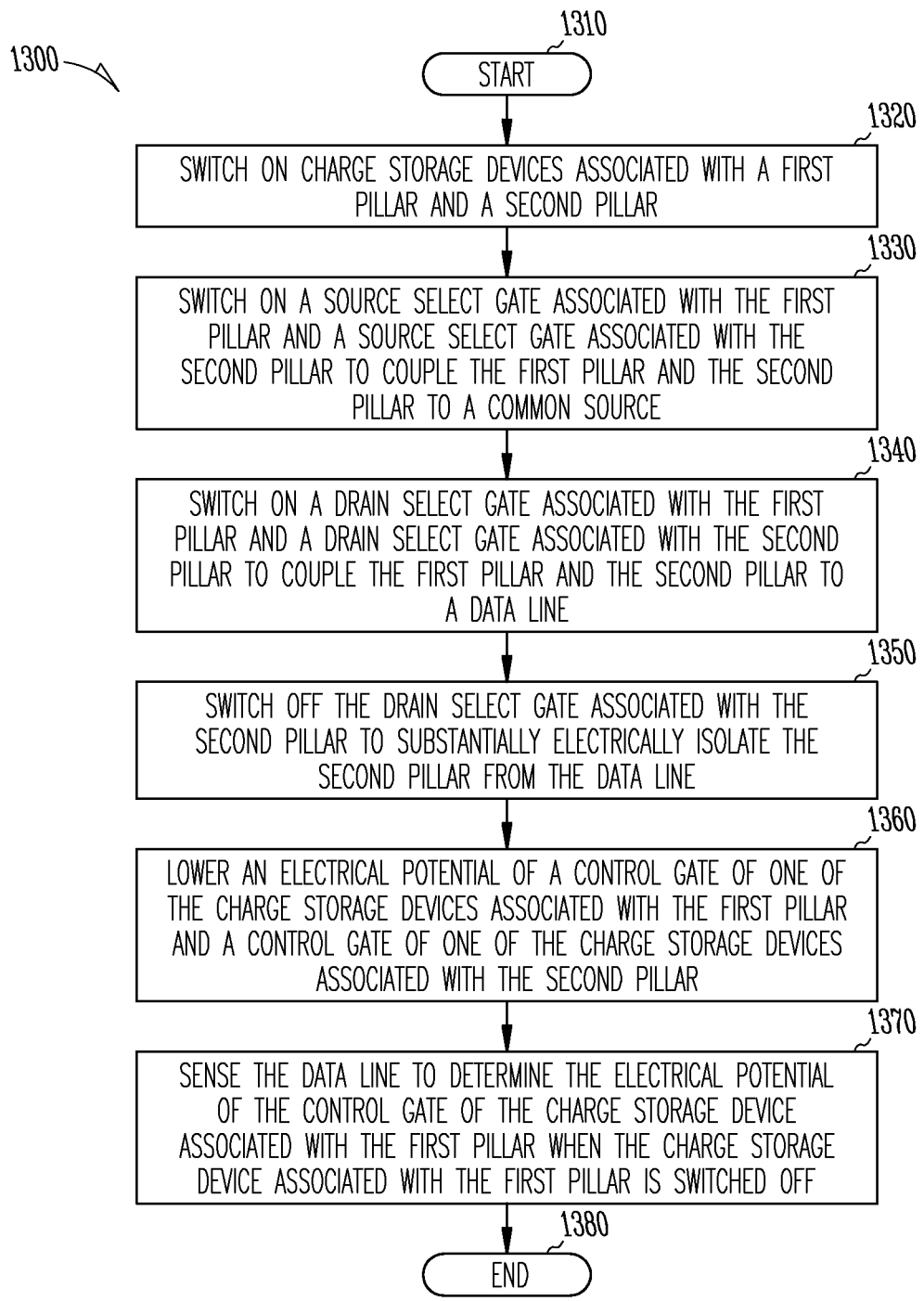
FIG. 13 is a flow diagram of a method according to various embodiments of the invention.

FIG. 13 is a flow diagram of a method 1300 according to various embodiments of the invention. In block 1310, the method 1300 starts. In block 1320, charge storage devices associated with a first pillar and a second pillar are switched on. In block 1330, a source select gate associated with the first pillar and a source select gate associated with the second pillar are switched on to couple the first pillar and the second pillar to a common source. In block 1340, a drain select gate associated with the first pillar and a drain select gate associated with the second pillar are switched on to couple the first pillar and the second pillar to a data line. In block 1350, the drain select gate associated with the second pillar is switched off to substantially electrically isolate the second pillar from the data line. In block 1360, an electrical potential of a control gate of one of the charge storage devices associated with the first pillar and a control gate of one of the charge storage devices associated with the second pillar is lowered. In block 1370, the data line is sensed to determine the electrical potential of the control gate of the charge storage device associated with the first pillar when the charge storage device associated with the first pillar is switched off. In block 1380, the method 1300 ends. Various embodiments may have more or fewer activities than those shown in FIG. 13. In some embodiments, the activities may be repeated, and/or performed in serial or parallel fashion. Some embodiments may comprise the same activities in a different order.

Figure 14:
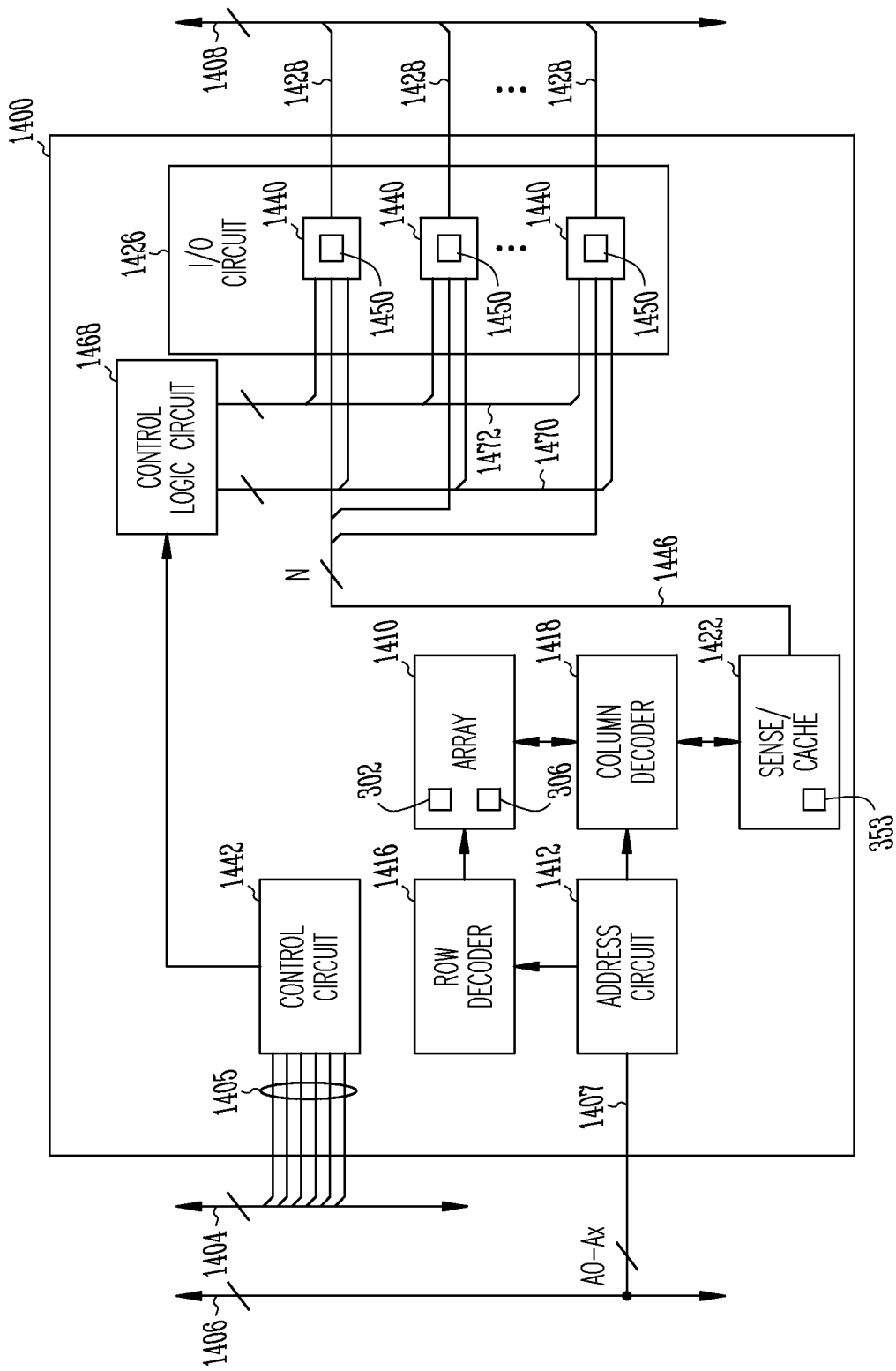
FIG. 14 is a diagram illustrating a system according to various embodiments of the invention.

FIG. 14 is a block diagram of an apparatus in the form of a memory device 1400 according to various embodiments of the invention. The memory device 1400 is coupled to a control bus 1404 to receive multiple control signals over control signal lines 1405. The memory device 1400 is also coupled to an address bus 1406 to receive address signals A0-Ax on address signal lines 1407 and to a data bus 1408 to transmit and receive data signals. Although depicted as being received on separate physical busses, the signals could also be multiplexed and received on the same physical bus.

The memory device 1400 includes one or more arrays 1410 of memory cells that can be arranged in rows and in columns. The memory cells of the array 1410 may comprise non-volatile memory cells (e.g., Flash memory cells with floating gate transistors or charge trap transistors) according to various embodiments of the invention. The memory device 1400 may comprise a NAND memory device. The array 1410 can include multiple banks and blocks of memory cells residing on a single die or on multiple dice as part of the memory device 1400. The memory cells in the array 1410 may comprise single level (SLC) and/or multilevel (MLC) memory cells. The array 1410 includes the strings 302 and 306 of charge storage devices shown in FIG. 3 according to various embodiments of the invention.

An address circuit 1412 can latch the address signals A0-Ax received on the address signal lines 1407. The address signals A0-Ax can be decoded by a row decoder 1416 and a column decoder 1418 to access data stored in the array 1410. The memory device 1400 can read data in the array 1410 by sensing voltage or current changes in memory cells in the array 1410 using sense devices in a sense/cache circuit 1422 including the sense and latch circuit 353 shown in FIG. 3 according to various embodiments of the invention.

A data input and output (I/O) circuit 1426 implements bi-directional data communication over external (e.g., data I/O) nodes 1428 coupled to the data bus 1408. The I/O circuit 1426 includes N driver and receiver circuits 1440 according to various embodiments of the invention. The memory device 1400 includes a controller that is configured to support operations of the memory device 1400, such as writing data to and/or erasing data from the array 1410. The controller can comprise, for example, control circuitry 1442 (e.g., configured to implement a state machine) on a same or different die than that which includes the array 1410 and/or any or all of the other components of the memory device 1400. The controller can comprise the control circuitry 1442, firmware, software or combinations of any or all of the foregoing. Data can be transferred between the sense/cache circuit 1422 and the I/O circuit 1426 over N signal lines 1446.

Each driver and receiver circuit 1440 includes a driver circuit 1450. Control signals can be provided to the driver circuits 1450 (e.g., through control logic circuit 1468 that is coupled to the control circuitry 1442). The control logic circuit 1468 can provide the control signals over lines 1470 and 1472 to the driver circuits 1450.

Sense and latch circuits such as the sense and latch circuit 353 shown in FIG. 3 and methods described herein can lower the time needed to complete a read operation. This can lead to a significant performance improvement over conventional technology.

With reference to FIGS. 1 and 2, bodies of the SGD 108, the SGS 230 and the charge storage devices 214 remain in a floating state when an electrical potential of a gate of one of the charge storage devices 214 is lower than an electrical potential of a source or a data line. When the gates of all of the charge storage devices 214 are raised to a high electrical potential initially, the bodies are substantially depleted so that the electrical potential of the bodies can be determined by the gate and source potentials. This results in greater confidence in the body potential and greater confidence in the threshold voltage of the charge storage devices.

Example structures and methods of sense and latch circuits have been described. Although specific embodiments have been described, it will be evident that various modifications and changes may be made to these embodiments. Accordingly, the specification and drawings are to be regarded in an illustrative rather than a restrictive sense. For example, an arrangement of an n-channel transistor and a p-channel transistor has been shown and described. The n-channel transistor may be replaced by a p-channel transistor or the p-channel transistor may be replaced by an n-channel transistor according to various embodiments of the invention.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method comprising:
raising an electrical potential of a plurality of access lines to a raised electrical potential, each access line associated with a charge storage device;
lowering the electrical potential of a selected one of the access lines; and
sensing a state of the charge storage device associated with the selected access line while the electrical potential of the selected access line is being lowered.

2. The method of claim 1, wherein each access line is adjacent to at least one of the other access lines.

3. The method of claim 1, wherein lowering the electrical potential of a selected one of the access lines further comprises lowering the electrical potential of the selected access line to a ground voltage.

4. The method of claim 1, wherein lowering the electrical potential of a selected one of the access lines further comprises lowering the electrical potential of the selected access line by voltage increments.

5. The method of claim 1, wherein the charge storage device associated with the selected access line is a multilevel charge storage device.

6. The method of claim 1, further comprising latching data representing a state of the charge storage device associated with the selected access line for each increment of change of the electrical potential of the selected access line.

7. The method of claim 1, wherein the access lines and the charge storage devices are associated with a pillar comprising semiconductor material.

8. A method comprising:
switching on a plurality of charge storage devices associated with a first pillar comprising semiconductor material;
incrementally reducing an electrical potential of a control gate of a selected one of the charge storage devices; and
sensing an electrical potential of the first pillar while the electrical potential of the control gate is being reduced to determine the electrical potential of the control gate when the selected charge storage device is switched off.

9. The method of claim 8, further comprising switching on a drain select gate associated with the first pillar to couple the first pillar to a data line.

10. The method of claim 9, further comprising switching off a drain select gate associated with a second pillar to substantially electrically isolate the second pillar from the data line.

11. The method of claim 10, further comprising switching on a source select gate associated with the first pillar and a source select gate associated with the second pillar to couple the first pillar and the second pillar to a common source line.

12. The method of claim 8, further comprising reducing the electrical potential of the control gate of the selected charge storage device in response to each edge of a clock signal.

13. The method of claim 12, further comprising latching data representing the electrical potential of the first pillar in response to each edge of the clock signal.

14. The method of claim 8, wherein switching on a plurality of charge storage devices associated with a first pillar further comprises raising an electrical potential of a control gate of each of the plurality of charge storage devices associated with the first pillar.

15. A method comprising:
switching on a charge storage device associated with a pillar comprising semiconductor material;
reducing an electrical potential of a control gate of the charge storage device; and
sensing an electrical potential of the pillar while the electrical potential of the control gate is being reduced to determine the electrical potential of the control gate when the charge storage device is switched off.

16. The method of claim 15, wherein reducing an electrical potential of a control gate further comprises reducing the electrical potential of the control gate of the charge storage device by voltage increments.

17. The method of claim 15, wherein reducing an electrical potential of a control gate further comprises reducing the electrical potential of the control gate of the charge storage device to a ground voltage.

18. A method comprising:
switching on a plurality of first charge storage devices associated with a first pillar comprising semiconductor material and switching on a plurality of second charge storage devices associated with a second pillar comprising semiconductor material;
switching on a first source select gate associated with the first pillar and a second source select gate associated with the second pillar to couple the first pillar and the second pillar to a common source;

switching on a first drain select gate associated with the first pillar and a second drain select gate associated with the second pillar to couple the first pillar and the second pillar to a data line;

switching off the second drain select gate associated with the second pillar to substantially electrically isolate the second pillar from the data line;

incrementally lowering an electrical potential of a first control gate of a selected one of the first charge storage devices and a second control gate of a selected one of the second charge storage devices; and sensing the data line while the electrical potential of the first control gate and the second control gate is being lowered to determine the electrical potential of the first control gate when the selected first charge storage device is switched off.

19. The method of claim 18, wherein incrementally lowering an electrical potential of the first control gate comprises lowering the electrical potential of the first control gate and the second control gate in response to each edge of a clock signal until a particular level of the electrical potential of the first control gate and the second control gate is established.

20. The method of claim 19, further comprising changing a value of a digital signal for each increment of change of the electrical potential of the first control gate and the second control gate, and wherein sensing the data line comprises latching a current value of the digital signal responsive to a change in conduction of the selected first charge storage device.

21. The method of claim 18, wherein switching on a plurality of charge storage devices associated with a pillar further comprises raising an electrical potential of a control gate of each of the plurality of first charge storage devices associated with the first pillar and raising an electrical potential of a control gate of each of the plurality of second charge storage devices associated with the second pillar.

22. The method of claim 18, further comprising switching off a third drain select gate associated with a third pillar to substantially electrically isolate the third pillar from the data line, a plurality of third charge storage devices associated with the third pillar.

23. The method of claim 22, further comprising switching off a third source select gate associated with the third pillar to substantially electrically isolate the third pillar from the common source.

* * * * *